(12) United States Patent
Latypov et al.

(10) Patent No.: US 9,009,634 B2
(45) Date of Patent: Apr. 14, 2015

(54) METHODS FOR FABRICATING INTEGRATED CIRCUITS INCLUDING GENERATING PHOTOMASKS FOR DIRECTED SELF-ASSEMBLY

(71) Applicant: GlobalFoundries, Inc., Grand Cayman (KY)

(72) Inventors: Azat Latypov, San Jose, CA (US); Yi Zou, Foster City, CA (US); Vito Dai, Santa Clara, CA (US)

(73) Assignee: GlobalFoundries, Inc., Grand Cayman (KY)

( * ) Notice: Subject to any disclaimer, the term of this patent is extended or adjusted under 35 U.S.C. 154(b) by 0 days.

(21) Appl. No.: 13/936,910

(22) Filed: Jul. 8, 2013

(65) Prior Publication Data

US 2015/0012896 A1    Jan. 8, 2015

(51) Int. Cl.
*G06F 17/50* (2006.01)
*G03F 7/20* (2006.01)

(52) U.S. Cl.
CPC .................................. *G03F 7/70441* (2013.01)

(58) Field of Classification Search
CPC .................................................. G03F 7/70441
USPC .......................................................... 716/55
See application file for complete search history.

(56) References Cited

U.S. PATENT DOCUMENTS

| | | | |
|---|---|---|---|
| 6,745,380 B2 | 6/2004 | Bodendorf et al. | |
| 7,237,221 B2 | 6/2007 | Granik et al. | |
| 7,521,094 B1 * | 4/2009 | Cheng et al. | 427/532 |
| 7,861,207 B2 | 12/2010 | Word et al. | |
| 7,903,856 B2 | 3/2011 | Pfister et al. | |
| 8,045,785 B2 * | 10/2011 | Kitamura et al. | 382/141 |
| 8,155,649 B2 | 4/2012 | McHenry et al. | |
| 8,326,313 B2 | 12/2012 | McHenry et al. | |
| 8,336,003 B2 | 12/2012 | Cheng et al. | |
| 8,656,322 B1 | 2/2014 | Dechene et al. | |
| 8,667,428 B1 | 3/2014 | Latypov | |
| 8,667,430 B1 | 3/2014 | Latypov | |
| 2008/0212857 A1 | 9/2008 | Pfister et al. | |

(Continued)

FOREIGN PATENT DOCUMENTS

| | | |
|---|---|---|
| JP | 200915491 A | 1/2009 |
| TW | 201124871 A1 | 7/2011 |

OTHER PUBLICATIONS

U.S. Appl. No. 14/072,164, filed Nov. 5, 2013.

(Continued)

*Primary Examiner* — Jack Chiang
*Assistant Examiner* — Brandon Bowers
(74) *Attorney, Agent, or Firm* — Ingrassia Fisher & Lorenz, P.C.

(57) ABSTRACT

Methods for fabricating integrated circuits are provided. In one example, a method for fabricating an integrated circuit includes generating a photomask for forming a DSA directing pattern on a semiconductor substrate. The DSA directing pattern is configured to guide a self-assembly material deposited thereon that undergoes directed self-assembly (DSA) to form a DSA pattern. Generating the photomask includes, using a computing system, inputting a DSA target pattern. Using the computing system, a DSA model, an OPC model, and a MPC model, cooperatively running a DSA PC algorithm, an OPC algorithm, and a MPC algorithm to produce an output MPCed pattern for a mask writer to write on the photomask.

20 Claims, 2 Drawing Sheets

(56) References Cited

U.S. PATENT DOCUMENTS

| | | | |
|---|---|---|---|
| 2009/0132984 A1 | 5/2009 | Chander et al. | |
| 2010/0075704 A1 | 3/2010 | McHenry et al. | |
| 2010/0097952 A1 | 4/2010 | McHenry et al. | |
| 2010/0105332 A1 | 4/2010 | McHenry et al. | |
| 2010/0173586 A1 | 7/2010 | McHenry et al. | |
| 2011/0209106 A1* | 8/2011 | Cheng et al. | 716/55 |
| 2012/0005634 A1 | 1/2012 | Seltmann et al. | |
| 2012/0141924 A1 | 6/2012 | Sahouria | |
| 2012/0329289 A1 | 12/2012 | Fujimura et al. | |
| 2012/0331428 A1 | 12/2012 | Cheng et al. | |
| 2013/0224635 A1 | 8/2013 | Takekawa et al. | |
| 2013/0283216 A1* | 10/2013 | Pearman et al. | 716/52 |
| 2013/0283218 A1 | 10/2013 | Fujimura et al. | |
| 2014/0127628 A1 | 5/2014 | Fujimura et al. | |
| 2014/0229904 A1 | 8/2014 | Fujimura et al. | |

OTHER PUBLICATIONS

U.S. Appl. No. 13/936,924, filed Jul. 8, 2013.

Ji Xu, Introduction to Directed Self-Assembly (DSA) of Block Copolymer (BCP) in Thin Films, Jun. 29, 2011.

Azat Latypov, What is Directed Self-Assembly, Oct. 20, 2011.

USPTO, Office Action for U.S. Appl. No. 13/659,453, mailed Jul. 9, 2013.

USPTO, Response to Office Action for U.S. Appl. No. 13/659,453, mailed Sep. 30, 2013.

USPTO, Notice of Allowance and Fee(s) Due for U.S. Appl. No. 13/659,453, mailed Oct. 15, 2013.

9. Daniel J.C. Herr, Directed block copolymer self-assembly for nanoelectronics fabrication, J. Mater. Res., vol. 26, No. 2, Jan 28, 2011.

23. Michael B. Giles and Niles A. Pierce, "An Introduction to the Adjoint Approach to Design", Flow, Turbulence and Combustion, 65(3-4):393-415, 2000.

H.-S. Philip Wong et al, "Block copolymer directed self-assembly enables sub-lithographic patterning for device fabrication", an oral presentation at the SPIE Advanced Lithography 2012 Symposium, to be published in the SPIE Advanced Lithography 2012 conference proceedings.

H.-S. Philip Wong, "Directed Self-Assembly for the Semiconductor Industry", an oral presentation at GlobalFoundries, Inc. Feb. 3, 2012.

Chi-Chun Liu et al, "Progress towards the integration of optical proximity correction and directed self-assembly of block copolymers with graphoepitaxy", an oral presentation at the SPIE Advanced Lithography 2012 Symposium, to be published in the SPIE Advanced Lithography 2012 conference proceedings.

Wikipedia contributors, "Copolymer", Wikipedia, The Free Encyclopedia, <http://en.wikipedia.org/w/index.php?title=Copolymer &oldid=457198836>. Oct. 24, 2011.

M. W. Matsen, Self-consistent field theory and its applications. In Soft Matter, vol. 1: Polymer Melts and Mixtures, Edited by G. Gompper and M. Schick (Wiley-VCH, Weinheim, 2006). ISBN: 3-527-30500-9, <http://www.personal.rdg.ac.uk/~sps96mwm/matsen_scft.pdf>.

Wikipedia contributors, "Penalty method", Wikipedia, The Free Encyclopedia, <http://en.wikipedia.org/w/index.php?&oldid=465609685>. Dec. 13, 2011.

Wikipedia contributors, "Gradient descent", Wikipedia, The Free Encyclopedia, <http://en.wikipedia.org/w/index.php?&oldid=486689439>. Apr. 10, 2012.

Wikipedia contributors, "Newton's method in optimization", Wikipedia, The Free Encyclopedia, <http://en.wikipedia.org/w/index.php?&oldid=480670839>. Mar. 7, 2012.

Wikipedia contributors, "Non-linear least squares", Wikipedia, The Free Encyclopedia, <http://en.wikipedia.org/w/index.php?&oldid=481409505>. Mar. 11, 2012.

Wikipedia contributors, "Gauss-Newton algorithm", Wikipedia, The Free Encyclopedia, <http://en.wikipedia.org/w/index.php?&oldid=478249186>. Feb. 22, 2012.

Wikipedia contributors, "Levenberg-Marquardt algorithm", Wikipedia, The Free Encyclopedia, <http://en.wikipedia.org/w/index.php?&oldid=486636602>. Apr. 10, 2012.

Wikipedia contributors, "Quasi-Newton method", Wikipedia, The Free Encyclopedia, <http://en.wikipedia.org/w/index.php?&oldid=483333808>. Mar. 22, 2012.

Wikipedia contributors, "Conjugate gradient method", Wikipedia, The Free Encyclopedia, <http://en.wikipedia.org/w/index.php?&oldid=487492827>. Apr. 15, 2012.

Austen G.Duffy "An Introduction to Gradient Computation by the Discrete Adjoint Method", Technical report, Florida State University (2009), <http://computationalmathematics.org/topics/files/adjoint-techreport.pdf>.

Taiwan Intellectual Property Office, Examination Report for Taiwanese Patent Application No. 102107449, mailed Jun. 19, 2014.

USPTO, Notice of Allowance and Fee(s) Due for U.S. Appl. No. 13/936,924, mailed Oct. 7, 2014.

USPTO, Office Action for U.S. Appl. No. 13/936,924, mailed Jun. 17, 2014.

* cited by examiner

METHODS FOR FABRICATING INTEGRATED CIRCUITS INCLUDING GENERATING PHOTOMASKS FOR DIRECTED SELF-ASSEMBLY

TECHNICAL FIELD

The technical field relates generally to methods for fabricating integrated circuits, and more particularly relates to methods for fabricating integrated circuits including generating photomasks for directed self-assembly.

BACKGROUND

Decreasing device size and increasing device density has traditionally been a high priority for the manufacturing of the integrated circuits. Optical lithography has been a driving force for device scaling. Conventional optical lithography is limited to about 80 nm pitch for single exposure patterning. While double and other multi-patterning processes can realize smaller pitch, these approaches are expensive and more complex.

Directed self-assembly (DSA), a technique that aligns self-assembling polymeric materials on a lithographically defined directing or guide pattern, is a potential option for extending current lithography beyond its pitch and resolution limits. The self-assembling materials, for example, are block copolymers (BCPs) that consist of a "A" homopolymer covalently attached to a "B" homopolymer, which are deposited over a lithographically defined directing pattern on a semiconductor substrate. The lithographically defined directing pattern is a pre-pattern (hereinafter "DSA directing pattern") that is encoded with spatial chemical and/or topographical information (e.g., chemical epitaxy and/or graphoepitaxy) and serves to direct the self-assembly process and the pattern formed by the self-assembling materials. Subsequently, by annealing the DSA polymers, the A polymer chains and the B polymer chains undergo phase separation to form an A polymer region and a B polymer region that are registered to the underlying DSA directing pattern to define a nanopattern (hereinafter "DSA pattern"). Then, by removing either the A polymer block or the B polymer block by wet chemical or plasma-etch techniques, a mask is formed for transferring the DSA pattern to the underlying semiconductor substrate.

Generating a photomask for lithographically defining the DSA directing pattern to accurately form the shape of the DSA pattern requires proper accounting of a multitude of physical effects that occur during the DSA process including from photomask writing on through to etching of the phase separated self-assembly materials to form the DSA pattern. For instance, a typical DSA process involves fabrication of a patterned photomask to be used to make the DSA directing pattern, exposing this photomask in a lithographic tool to photoresist that is disposed on a semiconductor substrate, developing and etching the exposed semiconductor substrate, processing the semiconductor substrate to create the DSA directing pattern, spin coating the pre-patterned semiconductor substrate with BCP, and annealing and etching the BCP to form the DSA pattern. Unfortunately, current approaches for generating a photomask for lithographically defining a DSA directing pattern to form a DSA pattern do not fully account for the physical effects that occur during the DSA process.

Accordingly, it is desirable to provide methods for fabricating integrated circuits including generating a photomask for lithographically defining a DSA directing pattern to accurately form a DSA pattern. Moreover, it is desirable to provide methods for fabricating integrated circuits including generating a photomask for lithographically defining a DSA directing pattern that more fully account for the physical effects that occur during a DSA process. Furthermore, other desirable features and characteristics of the present invention will become apparent from the subsequent detailed description and the appended claims, taken in conjunction with the accompanying drawings and this background.

BRIEF SUMMARY

Methods for fabricating integrated circuits are provided herein. In accordance with an exemplary embodiment, a method for fabricating an integrated circuit includes generating a photomask for forming a DSA directing pattern on a semiconductor substrate. The DSA directing pattern is configured to guide a self-assembly material deposited thereon that undergoes directed self-assembly (DSA) to form a DSA pattern. Generating the photomask includes, using a computing system, inputting a DSA target pattern. Using the computing system, a DSA model, an OPC model, and a MPC model, cooperatively running a DSA PC algorithm, an OPC algorithm, and a MPC algorithm to produce an output MPCed pattern for a mask writer to write on the photomask.

In accordance with another exemplary embodiment, a method for fabricating an integrated circuit is provided. The method includes generating a photomask for forming a DSA directing pattern on a semiconductor substrate. The DSA directing pattern is configured to guide a self-assembly material deposited thereon that undergoes directed self-assembly (DSA) to form a DSA pattern. Generating the photomask includes, using a computing system, inputting a DSA target pattern. Using the computing system, a DSA model, and the DSA target pattern, running a DSA PC algorithm to produce an output DSA directing pattern. Using the computing system, an OPC model, and the output DSA directing pattern, running an OPC algorithm to produce an output OPCed pattern for patterning the photomask. Using the computing system, a MPC model, and the output OPCed pattern, running a MPC algorithm to produce an output MPCed pattern. Using the computing system, communicating the output MPCed pattern to a mask writer to write on the photomask.

In accordance with another exemplary embodiment, a method for fabricating an integrated circuit is provided. The method includes generating a photomask for forming a DSA directing pattern on a semiconductor substrate. The DSA directing pattern is configured to guide a self-assembly material deposited thereon that undergoes directed self-assembly (DSA) to form a DSA pattern. Generating the photomask includes, using a computing system, inputting a DSA target pattern. Using the computing system, a DSA model, and the DSA target pattern, running a DSA PC algorithm using manufacturability constraints for an optical process to produce an output DSA directing pattern with realistic OPC targets that can be fabricated in lithography. Using the computing system, an OPC model, and the output DSA directing pattern, running an OPC algorithm to produce an output OPCed pattern for patterning the photomask. Using the computing system, a MPC model, and the output OPCed pattern, running a MPC algorithm to produce an output MPCed pattern. Using the computing system, communicating the output MPCed pattern to a mask writer to write on the photomask.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
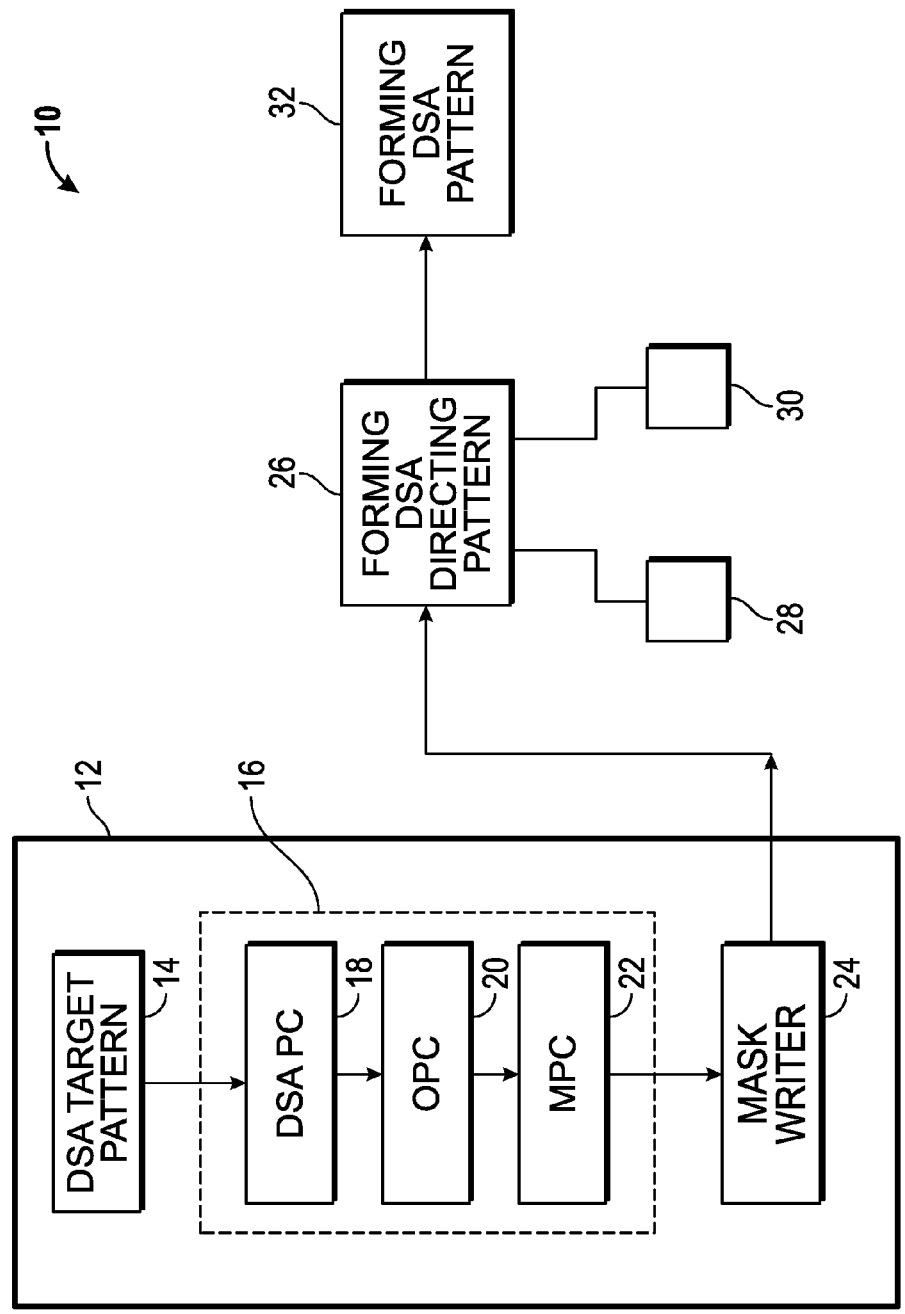
FIG. 1 is a schematic illustration of a block diagram of a method for fabricating an integrated circuit in accordance with an exemplary embodiment.

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to methods for fabricating integrated circuits. The exemplary embodiments taught herein generate a photomask for forming a DSA directing pattern on a semiconductor substrate. The DSA directing pattern is for guiding a self-assembly material (e.g., BCP) that is deposited on the DSA directing pattern and that undergoes directed self-assembly (DSA), e.g., phase separation during annealing, to form a DSA pattern. In an exemplary embodiment, the photomask is generated by inputting a DSA target pattern into a computing system. The DSA target pattern is a desired or predetermined DSA pattern that is to be fabricated on the semiconductor substrate using the DSA process.

In an exemplary embodiment, a DSA PC (directed self-assembly process/proximity correction) algorithm is run using the computing system, a DSA model, and the DSA target pattern to produce an output DSA directing pattern. The DSA PC algorithm is an algorithm that takes as an input the DSA target pattern that is to be fabricated using the DSA process and provides as an output the output DSA directing pattern (e.g., a chemical epitaxy pre-pattern or a graphoepitaxy pre-pattern). The DSA PC algorithm takes into account the physical effects that occur during the DSA process including annealing and etching of the self-assembly material to ensure that the DSA pattern resulting from DSA processing of the DSA directing pattern is close to or substantially matches the DSA target pattern. The DSA PC algorithm uses the DSA model that computes the DSA fabricated pattern given the DSA directing pattern.

In an exemplary embodiment, an OPC (optical proximity correction) algorithm is then run using the computing system, an OPC model, and the output DSA directing pattern to produce an output OPCed pattern. The OPC algorithm is an algorithm that takes as an input the OPC target pattern (e.g., polygons) that needs to be written on a photoresist layer that is deposited on the semiconductor substrate and provides as an output the output OPCed pattern, i.e., the pattern that needs to be written on the photomask. The OPC algorithm takes into account the physical effects that occur during the exposure of the photoresist coated semiconductor substrate in the lithography tool and also in the development and etching of the exposed photoresist coated semiconductor substrate to ensure that the wafer pattern resulting from the exposure of the OPCed pattern is close to or substantially matches the OPC target pattern. The OPC algorithm uses the OPC model that computes the patterns written on the wafer given the patterns written on the photomask.

In an exemplary embodiment, a MPC (mask process/proximity correction) algorithm is then run using the computing system, a MPC model, and the output OPCed pattern to produce an output MPCed pattern. The MPC algorithm is an algorithm that takes as an input the MPC target pattern (e.g., polygons) that needs to be written on the photomask and provides as an output the output MPCed pattern, i.e., the pattern (or shots) communicated to the mask writer. The MPC algorithm takes into account various mask writing effects (e.g., long range and short range proximity effects) to ensure that when the mask writer writes the MPCed pattern, the actual pattern written on the photomask is close to or substantially matches the MPC target pattern. The MPC algorithm uses the MPC model that computes the pattern written on the photomask given the pattern (or shots) communicated to the mask writer.

In an exemplary embodiment, the output MPCed pattern is communicated to a mask writer for writing on the photomask to produce a patterned photomask. Because a multitude of physical effects that occur during the DSA process including from photomask writing on through to etching of the phase separated self-assembly material have been accounted for in defining the output MPCed pattern, the patterned photomask can be used to lithographically define a DSA directing pattern that accurately forms the shape of the DSA pattern, e.g., target the DSA pattern.

FIG. 1 is a schematic illustration of a block diagram of a method 10 for fabricating an integrated circuit (IC) in accordance with an exemplary embodiment. The described process steps, procedures, and materials are to be considered only as exemplary embodiments designed to illustrate to one of ordinary skill in the art methods for practicing the methods contemplated herein; the methods are not limited to these exemplary embodiments. Various steps in the manufacture of ICs are well known and so, in the interest of brevity, many conventional steps will only be mentioned briefly herein or will be omitted entirely without providing the well-known process details.

The method 10 includes generating a photomask (step 12) for forming a DSA directing pattern on a semiconductor substrate. The photomask may be, for example, an optical lithography photomask or an extreme ultraviolet (EUV) lithography photomask. The DSA directing pattern is for guiding a DSA material deposited on the DSA directing pattern during a DSA process in which the DSA material undergoes DSA (e.g., nano-size/scale phase separation that is registered to the DSA directing pattern) to form a DSA pattern.

As illustrated and will be described in further detail below, a DSA target pattern is input into a computer system (step 14). The DSA target pattern is used in a decoupled global flow 16 that includes a DSA model, an OPC model, and a MPC model to account for a multitude of physical effects that occur during the DSA process.

In an exemplary embodiment, using the computing system, the DSA model, and the DSA target pattern, a DSA PC algorithm is run (step 18) to produce an output DSA directing pattern. As discussed above, the DSA PC algorithm is an algorithm that takes as an input the DSA target pattern that is to be fabricated using the DSA process and provides as an output the output DSA directing pattern (e.g., a chemical epitaxy pre-pattern or a graphoepitaxy pre-pattern, e.g., confinement wells). The DSA PC algorithm takes into account the physical effects that occur during the DSA process including annealing and etching of the self-assembly material to ensure that the DSA pattern resulting from DSA processing of the DSA directing pattern is close to or substantially matches the DSA target pattern. The DSA PC algorithm uses the DSA model that computes the DSA fabricated pattern given the DSA directing pattern. One example of a generic DSA PC algorithm is included in the following MATLAB-like pseudocode:

```
function DSA_directing_patterns = DSAPC(DSA_model,DSA_target_patterns, DSAPC_parameters)
DSA_directing_patterns_current(1) = initialize_DSA_patterns(DSA_model, DSA_target_patterns);
for iteration =1:DSAPC_parameters.n_iterations
    DSA_patterns = apply_DSA_model(DSA_directing_patterns_current(iteration), ...
                                   DSA_model);
    residual = compute_DSAPC_residual(DSA_patterns, ...
                                      DSA_target_patterns);
    if(DSAPC_norm(residual) < DSAPC_parameters.tolerance)
        DSA_directing_patterns = DSA_directing_patterns_current(iteration);
        return
    else
        DSA_directing_patterns_current(iteration+1) =   DSAPC_update( ...
                                                        DSA_directing_patterns_current(iteration), ...
                                                        DSA_target_patterns, ...
                                                        residual, ...
                                                        DSA_model, ...
DSAPC_parameters);
    end
end
disp('DSA PC iterations did not converge');
end
```

In this example, the DSAPC( ) function takes as inputs the DSA model, the DSA target patterns, and the parameters of the DSA PC algorithm and outputs the DSA directing patterns. In the DSAPC( ) function, the DSA directing patterns are generated iteratively. These patterns are initialized and the iterations are run within an iterative loop. On each pass of the loop (for each iteration), the DSA model is first applied to the current directing patterns to compute the residual (the discrepancy between the DSA patterns corresponding to the given directing patterns and the target DSA patterns). Depending on the value of a certain cost function, and dependent on the residual, the current directing patterns are either output as the output of the DSAPC( ) function, if the norm of the residual is sufficiently small, or are updated for the next iteration to further reduce the cost function value corresponding to the residual. Other DSA PC algorithms known to those skilled in the art may also be used.

The term "target DSA patterns" is used herein to denote the patterns that are desired or predetermined to be fabricated on the semiconductor substrate using the DSA process. For instance, these patterns may include lines and spaces, isolated lines, contact holes, and other features, e.g., typically polygon type features, needed for IC fabrication. Target DSA patterns can be specified as a set of polygons or a set of smooth curves.

In an exemplary embodiment, the method 10 continues by running an OPC algorithm (step 20) using the computing system, the OPC model, and the output DSA directing pattern to produce an output OPCed pattern for patterning the photomask. As discussed above, the OPC algorithm is an algorithm that takes as an input the OPC target pattern (e.g., polygons) that needs to be written on a photoresist layer that is deposited on the semiconductor substrate and provides as an output the output OPCed pattern, i.e., the pattern that needs to be written on the photomask. The OPC algorithm takes into account the physical effects that occur during the exposure of the photoresist coated semiconductor substrate in a lithography tool (e.g., optical lithography tool or EUV lithography tool) and also in the development and etching of the exposed photoresist coated semiconductor substrate to ensure that the wafer pattern resulting from the exposure of the OPCed pattern is close to or substantially matches the OPC target pattern. The OPC algorithm uses the OPC model that computes the patterns written on the wafer given the patterns written on the photomask. One example of a generic OPC algorithm is included in the following MATLAB-like pseudocode:

```
function OPCed_patterns = OPC(OPC_model,OPC_target_patterns, OPC_parameters)
OPCed_patterns_current(1) = initialize_OPCed_patterns(OPC_model, OPC_target_patterns);
for iteration =1:OPC_parameters.n_iterations
    wafer_patterns = apply_OPC_model(OPCed_patterns_current(iteration), ...
                                     OPC_model);
    residual = compute_OPC_residual(wafer_patterns, ...
                                    OPC_target_patterns);
    if(OPC_norm(residual) < OPC_parameters.tolerance)
        OPCed_patterns = OPCed_patterns_current(iteration);
        return
    else
        OPC_patterns_current(iteration+1) = OPC_update(OPCed_patterns_current(iteration), ...
                                                       OPC_target_patterns, ...
                                                       residual, ...
                                                       OPC_model, ...
                                                       OPC_parameters);
    end
end
disp('OPC iterations did not converge');
end
```

In this example, the OPC( ) function takes as inputs the OPC model, the OPC target patterns, and the parameters of the OPC algorithm and outputs the OPCed patterns. In the OPC( ) function, the OPCed patterns are generated iteratively. These patterns are initialized and the iterations are run within an iterative loop. On each pass of the loop (for each iteration), the OPC model is first applied to the current OPCed patterns to compute the residual (the discrepancy between the OPC patterns corresponding to the given OPCed patterns and the OPC target patterns). Depending on the value of a certain cost function, and dependent on the residual, the current OPCed patterns are either output as the output of the OPC( ) function, if the norm of the residual is sufficiently small, or are updated for the next iteration to further reduce the cost function value corresponding to the residual. Other OPC algorithms known to those skilled in the art may also be used.

In an exemplary embodiment, the method 10 continues by running a MPC algorithm (step 22) using the computing system, the MPC model, and the output OPCed pattern to produce an output MPCed pattern. As discussed above, the MPC algorithm is an algorithm that takes as an input the MPC target pattern (e.g., polygons) that needs to be written on the photomask and provides as an output the output MPCed pattern, i.e., the pattern (or shots) communicated to the mask writer. The MPC algorithm takes into account various mask writing effects (e.g., long range and short range proximity effects) to ensure that when the mask writer writes the MPCed pattern, the actual pattern written on the photomask is close to or substantially matches the MPC target pattern. The MPC algorithm uses the MPC model that computes the pattern written on the photomask given the pattern (or shots) communicated to the mask writer. One example of a generic MPC algorithm is presented by the following MATLAB-like pseudocode:

```
function MPCed_patterns = MPC(MPC_model,MPC_target_patterns, MPC_parameters)
MPCed_patterns_current(1) = MPCed_patterns(MPC_model, MPC_target_patterns);
for iteration =1:MPC_parameters.n_iterations
    mask_patterns = apply_MPC_model(MPCed_patterns_current(iteration), ...
                                    MPC_model);
    residual = compute_MPC_residual(mask_patterns, ...
                                    MPC_target_patterns);
    if(MPC_norm(residual) < MPC_paraneters.tolerance)
        MPCed_patterns = MPCed_patterns_current(iteration);
        return
    else
        MPCed_patterns_current(iteration+1) = MPC_update(MPCed_patterns_current(iteration), ...
                                                        MPC_target_patterns, ...
                                                        residual, ...
                                                        MPC_model, ...
                                                        MPC_parameters);
    end
end
disp('MPC iterations did not converge');
end
```

In this example, the MPC( ) function takes as inputs the MPC model, the MPC target patterns, and the parameters of the MPC algorithm and outputs the MPCed patterns. In the MPC( ) function, the MPCed patterns are generated iteratively. These patterns are initialized and the iterations are run within an iterative loop. On each pass of the loop (for each iteration), the MPC model is first applied to the current MPCed patterns to compute the residual (the discrepancy between the MPC patterns corresponding to the given MPCed patterns and the MPC target patterns). Depending on the value of a certain cost function, and dependent on the residual, the current directing patterns are either output as the output of the MPC( ) function, if the norm of the residual is sufficiently small, or are updated for the next iteration to further reduce the cost function value corresponding to the residual.

In an exemplary embodiment, the decoupled global flow 16 is a fully decoupled global flow in which the DSA PC algorithm, the OPC algorithm, and the MPC algorithms are run 18, 20, and 22 consecutively as described above with the output of each of these algorithms being passed on as an input to the next algorithm in the sequence. One example of a generic fully decoupled global flow is presented by the following MATLAB-like pseudocode:

```
function MPCed_patterns = FULLY_DECOUPLED_GLOBAL_FLOW(DSA_target_patterns, ...
                                                     DSA_model, DSAPC_parameters, ...
                                                     OPC_model, OPC_parameters, ...
                                                     MPC_model, MPC_parameters)
    DSA_directing_patterns = DSAPC(DSA_model,DSA_target_patterns, DSAPC_parameters);
    OPCed_patterns = OPC(OPC_model,DSA_directing_patterns, OPC_parameters);
    MPCed_patterns = MPC(MPC_model,OPCed_patterns, MPC_parameters);
end
```

In this example, the fully decoupled global flow( ) function takes as inputs the DSA target patterns, the DSA model, the parameters of the DSA PC algorithm, the OPC model, the parameters of the OPC algorithm, the MPC model, and the parameters of the MPC algorithm. In the fully decoupled global flow( ) function, the MPCed patterns are generated by sequentially running the DSA PC algorithm, the OPC algorithm, and the MPC algorithms in which the output from the DSA PC program (i.e., DSA directing patterns) is the input to the OPC algorithm, and the output from the OPC algorithm (i.e., OPCed patterns) is the input to the MPC algorithm, and the output from the MPC algorithm is the MPCed patterns.

In another exemplary embodiment, the decoupled global flow 16 is a decoupled global flow with realistic OPC targets. The decoupled global flow with realistic OPC targets operates similarly to the fully decoupled global flow except that a modified DSA PC algorithm (e.g., DSA PC algorithm using manufacturability constraints for an optical process) is used in which the DSA PC iterations are conducted in such a way that the final DSA directing patterns are realistic OPC targets. In particular, the targets for the OPC algorithm include a set of polygonal features. However, especially for the advanced lithography nodes, the OPC algorithm may not always fully match the polygonal targets. One example is with corner rounding in which the corner of a polygon may be difficult to match using the feature images by diffraction-limited optics. Because of corner rounding of certain polygon features or other like limitations, an advanced lithographic node OPC may use realistic OPC targets, i.e., OPC targets that the OPC algorithm can match with a higher accuracy. Such realistic OPC targets can be obtained from the original polygonal OPC targets by applying geometrical corner rounding or spline interpolation to the edges of the original polygons. Utilizing the realistic OPC targets is particularly useful for DSA applications in which the directing patterns are patterned using optical or EUV lithography and the OPC algorithm is run to apply the OPC corrections and to compute the OPCed patterns. If the DSA PC algorithm outputs the DSA directing patterns that are not a realistic OPC target, the OPC algorithm will match these directing patterns potentially with an error, resulting in a potential discrepancy between the desired DSA directing patterns and the DSA directing patterns fabricated using optical or EUV lithography. One example of a generic decoupled global flow with realistic OPC targets is presented by the following MATLAB-like pseudocode:

The method 10 continues by forming the DSA directing pattern overlying a semiconductor substrate (step 26). Forming the DSA directing pattern (step 26) includes patterning a photoresist layer that overlies the semiconductor substrate using the photomask. In an exemplary embodiment, the photoresist layer can be patterned with the photomask using well known optical or EUV lithographic techniques. In one embodiment, the photoresist layer is patterned for forming the DSA directing pattern having a graphoepitaxy surface (step 28) as is known in the art. In an exemplary embodiment, the graphoepitaxy surface includes confinement wells that define pre-pattern openings. In an alternative embodiment, the patterned photoresist layer is used for forming the DSA directing pattern having a chemical epitaxy surface (step 30) as is known in the art.

The method 10 continues by forming the DSA pattern (step 32). In an exemplary embodiment in which the DSA directing pattern has the graphoepitaxy surface, the DSA pattern is formed (step 32) by depositing a self-assembly material (BCP) on the graphoepitaxy surface including into the pre-pattern opening. In an alternative embodiment in which the DSA directing pattern has the chemical epitaxy surface, the self-assembly material is deposited overlying the chemical epitaxy surface. The self-assembly material is then annealed

```
function MPCed_patterns = DECOUPLED_GLOBAL_FLOW_REALISTIC(DSA_target_patterns, ...
                                       DSA_model, DSAPC_parameters, ...
                                       OPC_model, OPC_parameters, ...
                                       MPC_model, MPC_parameters)
DSA_directing_patterns = DSAPC_realistic(DSA_model,DSA_target_patterns, DSAPC_parameters, ...
                                       OPC_model, OPC_parameters);
OPCed_patterns = OPC(OPC_model,DSA_directing_patterns, OPC_parameters);
MPCed_patterns = MPC(MPC_model,OPCed_patterns, MPC_parameters);
end
```

In this example, the DECOUPLED_GLOBAL_FLOW_REALISTIC( ) function takes as inputs the DSA target patterns, the DSA model, the parameters of the DSA PC algorithm, the OPC model, the parameters of the OPC algorithm, the MPC model, and the parameters of the MPC algorithm. In the DECOUPLED_GLOBAL_FLOW_REALISTIC( ) function, the MPCed patterns are generated by sequentially running a DSA PC algorithm (a function DSAPC_realistic( )) outputting realistic OPC targets, the OPC algorithm, and the MPC algorithms in which the output from the DSAPC_realistic( ) function (i.e., DSA directing patterns, which are realistic OPC targets) is the input to the OPC algorithm, and the output from the OPC algorithm (i.e., OPCed patterns) is the input to the MPC algorithm, and the output from the MPC algorithm is the MPCed patterns. The DSA PC realistic algorithm is the DSA PC algorithm but modified so that the DSA PC iterations also use the OPC model and the parameters of the OPC algorithm. Utilizing the DSA_PC_realistic( ) function ensures that the DSA directing patterns are realistic OPC targets that reduce the discrepancy between the directing patterns desired by the DSA PC algorithm and the patterns that can be fabricated on the semiconductor substrate using optical or EUV lithography.

The method 10 continues by communicating the output MPCed pattern to a mask writer and writing on the photomask (step 24) to produce a patterned photomask. Because a multitude of physical effects of the DSA process have been accounted for in defining the output MPCed pattern, the patterned photomask can be used to lithographically define a DSA directing pattern that accurately forms the shape of the DSA pattern.

and etched to define the DSA pattern. The self-assembly material is deposited, annealed, and etched as described above using well known techniques.

Figure 2:
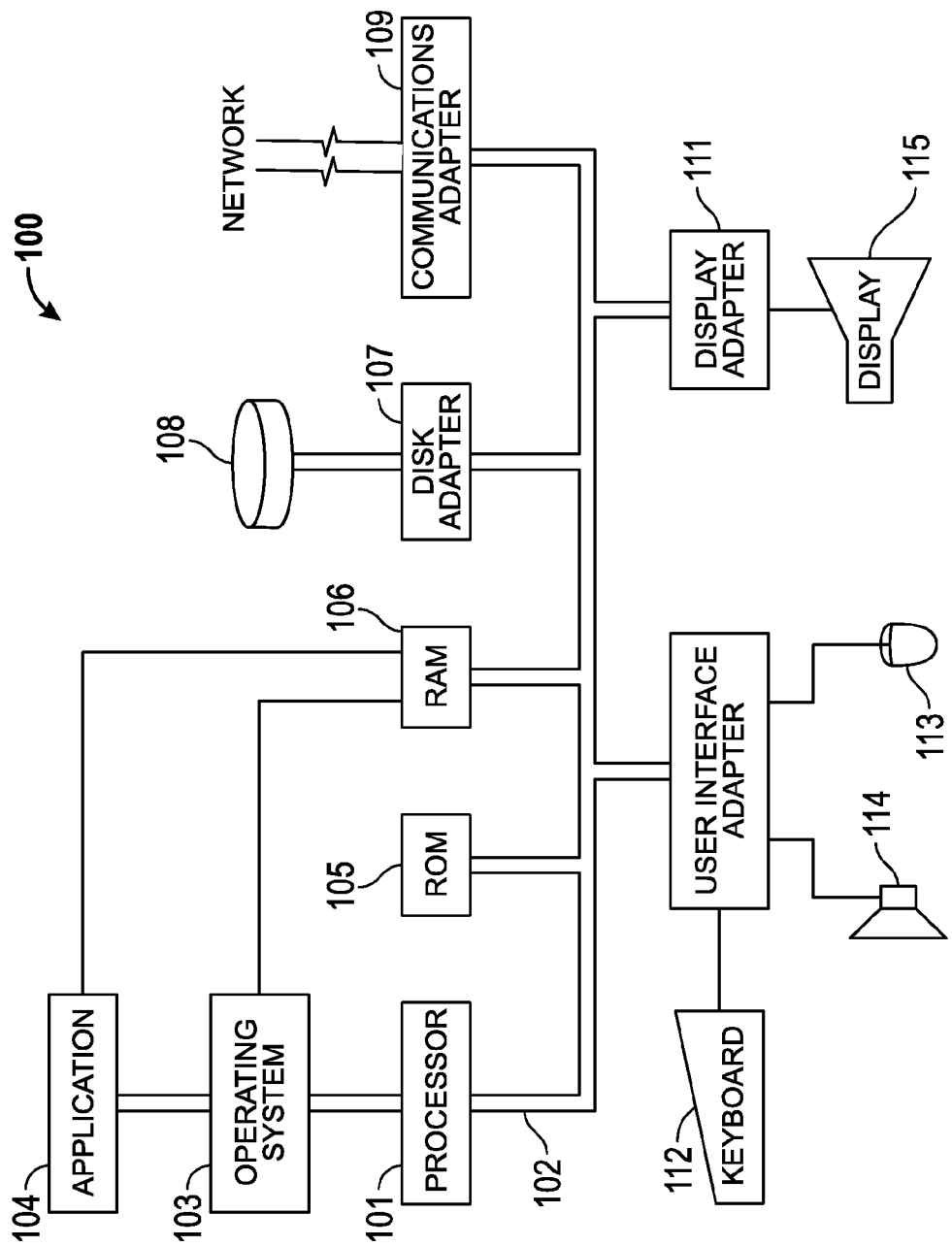
FIG. 2 is a schematic illustration of a block diagram of a computing system arranged in accordance with an exemplary embodiment.

FIG. 2 is a schematic illustration of a block diagram of a computing system 100 arranged in accordance with an exemplary embodiment. The various embodiments disclosed herein can be implemented on the computing system 100. The computing system 100 is also representative of a hardware environment for the present disclosure. For example, the computing system 100 may have a processor 101 coupled to various other components by a system bus 102.

An operating system 103 may run on the processor 101 and provide control and coordinate the functions of the various components of FIG. 2. An application 104 in accordance with the principles of examples of the present disclosure may execute in conjunction with the operating system 103 and provide calls and/or instructions to the operating system 103 where the calls/instructions implement the various functions or services to be performed by the application 104.

A read-only memory ("ROM") 105 may be coupled to a system bus 102 and can include a basic input/output system ("BIOS") that can control certain basic functions of the computing system 100. A random access memory ("RAM") 106 and a disk adapter 107 may also be coupled to system bus 102. It should be noted that software components, including the operating system 103 and the application 104, may be loaded into a RAM 106, which may be computing system's main memory for execution. The disk adapter 107 may be provided which can be an integrated drive electronics ("IDE") or parallel advanced technology attachment ("PATA") adapter, a serial advanced technology attachment ("SATA") adapter, a small computer system interface ("SCSI") adapter, a universal serial bus ("USB") adapter, an IEEE 1394 adaptor, or any other appropriate adapter that communicates with a disk unit 108, e.g., disk drive.

The computing system 100 may further include a communications adapter 109 coupled to the system bus 102. The communications adapter 109 may interconnect the system bus 102 with an external network (not shown) thereby facilitating the computing system 100 to communicate with other similar and/or different devices.

Input/Output ("I/O") devices may also be connected to the computing system 100 via a user interface adapter 110 and a display adapter 111. For example, a keyboard 112, a mouse 113, and a speaker 114 may be interconnected to the system bus 102 through the user interface adapter 110. Data may be provided to the computing system 100 through any of these example devices. A display monitor 115 may be connected to the system bus 102 by any display adapter 111. In this example manner, a user can provide data or other information to the computing system 100 through the keyboard 112 and/or the mouse 113, and obtain output from the computing system 100 via the display 115 and/or the speaker 114.

Accordingly, methods for fabricating integrated circuits including generating photomasks for DSA have been described. In an exemplary embodiment, a photomask is generated for forming a DSA directing pattern on a semiconductor substrate. The DSA directing pattern is for guiding a self-assembly material deposited thereon that undergoes DSA to form a DSA pattern. Generating the photomask includes, using a computing system, inputting a DSA target pattern. Using the computing system, a DSA model, an OPC model, and a MPC model, cooperatively running a DSA PC algorithm, an OPC algorithm, and a MPC algorithm to produce an output MPCed pattern for a mask writer to write on the photomask.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit comprising:
    generating a photomask for forming a DSA directing pattern on a semiconductor substrate, wherein the DSA directing pattern is configured to guide a self-assembly material deposited thereon that undergoes directed self-assembly (DSA) to form a DSA pattern, and wherein generating the photomask comprises:
        using a computing system, inputting a DSA target pattern;
        using the computing system, a DSA model, an optical proximity correction (OPC) model, and a mask process/proximity correction (MPC) model, cooperatively running a DSA proximity correction (PC) algorithm, an OPC algorithm, and a MPC algorithm to produce an output MPCed pattern for a mask writer to write on the photomask, wherein using the DSA, OPC, and MPC models comprise running the DSA PC algorithm, the OPC algorithm, and the MPC algorithm sequentially in the order given to define a decoupled global flow sequence in which an output of each of the DSA PC and OPC algorithms is an input to a next algorithm in the decoupled global flow sequence with the MPC algorithm outputting the output MPCed pattern, and writing the output MPCed pattern on the photomask using the mask writer.

2. The method of claim 1, wherein inputting the DSA target pattern comprises inputting a line and space pattern, an isolated line pattern, a contact hole pattern, and/or other polygon pattern.

3. The method of claim 1, wherein cooperatively running the DSA PC algorithm comprises running the DSA PC algorithm using the DSA model and the DSA target pattern to produce an output DSA directing pattern.

4. The method of claim 3, wherein cooperatively running the DSA PC algorithm comprises running the OPC algorithm using the OPC model and the output DSA directing pattern to produce an output OPCed pattern for patterning the photomask.

5. The method of claim 4, wherein cooperatively running the DSA PC algorithm comprises running the MPC algorithm using the MPC model and the output OPCed pattern to produce the output MPCed pattern.

6. The method of claim 3, wherein cooperatively running the DSA PC algorithm comprises running the DSA PC algorithm using manufacturability constraints for an optical process to produce the output DSA directing pattern with realistic OPC targets that can be fabricated in lithography.

7. The method of claim 1, wherein generating the photomask comprises generating an optical lithography photomask.

8. The method of claim 1, wherein generating the photomask comprises generating an extreme ultraviolet (EUV) lithography photomask.

9. A method for fabricating an integrated circuit comprising:
    generating a photomask for forming a DSA directing pattern on a semiconductor substrate, wherein the DSA directing pattern is configured to guide a self-assembly material deposited thereon that undergoes directed self-assembly (DSA) to form a DSA pattern, and wherein generating the photomask comprises:
        using a computing system, inputting a DSA target pattern;
        using the computing system, a DSA model, and the DSA target pattern, running a DSA proximity correction (PC) algorithm to produce an output DSA directing pattern;
        using the computing system, an optical proximity correction (OPC) model, and the output DSA directing pattern, running an OPC algorithm to produce an output OPCed pattern for patterning the photomask;
        using the computing system, a mask process/proximity correction (MPC) model, and the output OPCed pattern, running a MPC algorithm to produce an output MPCed pattern, wherein using the DSA, OPC, and MPC models comprise running the DSA PC algorithm, the OPC algorithm, and the MPC algorithm sequentially in the order given to define a decoupled global flow sequence in which an output of each of the DSA PC and OPC algorithms is an input to a next algorithm in the decoupled global flow sequence with the MPC algorithm outputting the output MPCed pattern;

using the computing system, communicating the output MPCed pattern to a mask writer to write on the photomask, and writing the output MPCed pattern on the photomask using the mask writer.

10. The method of claim 9, further comprising:
patterning a photoresist layer on the semiconductor substrate using the photomask.

11. The method of claim 10, wherein patterning the photoresist layer comprises patterning the photoresist layer to form the DSA directing pattern having a graphoepitaxy surface that defines a pre-pattern opening.

12. The method of claim 11, further comprising depositing the self-assembly material on the graphoepitaxy surface including into the pre-pattern opening.

13. The method of claim 12, further comprising phase separating the self-assembly material to define the DSA pattern.

14. The method of claim 13, further comprising etching the DSA pattern to form a mask for transferring the DSA pattern to the semiconductor substrate.

15. The method of claim 10, wherein patterning the photoresist layer comprises patterning the photoresist layer to form a patterned photoresist layer, and wherein the method further comprises:
using the patterned photoresist layer to form the DSA directing pattern having a chemical epitaxy surface.

16. The method of claim 15, further comprising depositing the self-assembly material on the chemical epitaxy surface.

17. The method of claim 16, further comprising phase separating the self-assembly material to define the DSA pattern.

18. The method of claim 17, further comprising etching the DSA pattern to form a mask for transferring the DSA pattern to the semiconductor substrate.

19. A method for fabricating an integrated circuit comprising:
generating a photomask for forming a DSA directing pattern on a semiconductor substrate, wherein the DSA directing pattern is configured to guide a self-assembly material deposited thereon that undergoes directed self-assembly (DSA) to form a DSA pattern, and wherein generating the photomask comprises:
using a computing system, inputting a DSA target pattern;
using the computing system, a DSA model, and the DSA target pattern, running a DSA proximity correction (PC) algorithm using manufacturability constraints for an optical process to produce an output DSA directing pattern with realistic OPC targets that can be fabricated in lithography;
using the computing system, an optical proximity correction (OPC) model, and the output DSA directing pattern, running an OPC algorithm to produce an output OPCed pattern for patterning the photomask;
using the computing system, a mask process/proximity correction (MPC) model, and the output OPCed pattern, running a MPC algorithm to produce an output MPCed pattern, wherein using the DSA, OPC, and MPC models comprise running the DSA PC algorithm, the OPC algorithm, and the MPC algorithm sequentially in the order given to define a decoupled global flow sequence in which an output of each of the DSA PC and OPC algorithms is an input to a next algorithm in the decoupled global flow sequence with the MPC algorithm outputting the output MPCed pattern;
using the computing system, communicating the output MPCed pattern to a mask writer to write on the photomask, and writing the output MPCed pattern on the photomask using the mask writer.

20. The method of claim 19, wherein inputting the DSA target pattern comprises inputting a polygon pattern, and wherein running the DSA PC algorithm comprises applying geometric corner rounding and/or spline interpolation to edges of one or more polygon features of the polygon pattern.

* * * * *